(12) United States Patent
Sorg et al.

(10) Patent No.: US 8,796,115 B2
(45) Date of Patent: Aug. 5, 2014

(54) LIGHT-EMITTING DIODE ARRANGEMENT AND METHOD FOR PRODUCING THE SAME

(75) Inventors: Jörg Erich Sorg, Regensburg (DE); Stefan Gruber, Bad Abbach (DE); Siegfried Herrmann, Neukirchen (DE); Berthold Hahn, Hemau (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 202 days.

(21) Appl. No.: 13/440,472

(22) Filed: Apr. 5, 2012

(65) Prior Publication Data

US 2012/0190140 A1 Jul. 26, 2012

Related U.S. Application Data

(63) Continuation of application No. 12/442,411, filed as application No. PCT/DE2007/001733 on Sep. 25, 2007, now Pat. No. 8,154,040.

(30) Foreign Application Priority Data

Sep. 27, 2006 (DE) .......................... 10 2006 045 691
May 4, 2007 (DE) .......................... 10 2007 021 009

(51) Int. Cl.
| | | |
|---|---|---|
| *H01L 21/00* | (2006.01) | |
| *H01L 23/00* | (2006.01) | |
| *H01L 25/075* | (2006.01) | |
| *H01L 33/50* | (2010.01) | |
| *H01L 33/00* | (2010.01) | |
| *H01L 33/62* | (2010.01) | |

(52) U.S. Cl.
CPC ............ *H01L 25/0753* (2013.01); *H01L 24/24* (2013.01); *H01L 2924/014* (2013.01); *H01L 2924/01033* (2013.01); *H01L 2924/01068* (2013.01); *H01L 2924/01015* (2013.01); *H01L 2224/48091* (2013.01); *H01L 2924/0102* (2013.01); *H01L 2924/01038* (2013.01); *H01L 33/508* (2013.01); *H01L 2924/01012* (2013.01); *H01L 2924/01058* (2013.01); *H01L 2224/76155* (2013.01); *H01L 2924/01105* (2013.01); *H01L 2429/01005* (2013.01); *H01L 2924/01082* (2013.01); *H01L 2224/82039* (2013.01); *H01L 33/0079* (2013.01); *H01L 24/82* (2013.01); *H01L 2924/01025* (2013.01); *H01L 2924/01004* (2013.01); *H01L 2924/01074* (2013.01); *H01L 2924/01029* (2013.01); *H01L 33/62* (2013.01); *H01L 2924/01013* (2013.01); *H01L 2924/09701* (2013.01); *H01L 2924/01078* (2013.01); *H01L 2924/01047* (2013.01); *H01L 2224/24226* (2013.01); *H01L 2924/01023* (2013.01); *H01L 2924/01079* (2013.01)

USPC .......................... 438/464; 438/116; 438/478

(58) Field of Classification Search
USPC .......................... 438/116, 464, 478
See application file for complete search history.

(56) References Cited

U.S. PATENT DOCUMENTS

| | | |
|---|---|---|
| 5,684,309 A | 11/1997 | McIntosh et al. |
| 5,831,277 A | 11/1998 | Razeghi |

(Continued)

FOREIGN PATENT DOCUMENTS

| | | |
|---|---|---|
| CA | 2 360 502 | 5/2001 |
| EP | 0 854 520 | 7/1998 |

(Continued)

*Primary Examiner* — James Mitchell
(74) *Attorney, Agent, or Firm* — Cozen O'Connor

(57) ABSTRACT

A light-emitting diode arrangement comprising a plurality of semiconductor chips which are provided for emitting electromagnetic radiation from their front side and which are fixed by their rear side—opposite the front side—on a first main face of a common carrier body, wherein the semiconductor chips consist of a respective substrateless semiconductor layer stack and are fixed to the common carrier body without an auxiliary carrier, and to a method for producing such a light-emitting diode arrangement.

15 Claims, 6 Drawing Sheets

(56) References Cited

U.S. PATENT DOCUMENTS

| | | |
|---|---|---|
| 6,172,382 B1 | 1/2001 | Nagahama et al. |
| 6,638,847 B1* | 10/2003 | Cheung et al. ............... 438/612 |
| 6,674,159 B1* | 1/2004 | Peterson et al. ............. 257/680 |
| 2004/0106234 A1* | 6/2004 | Sorg et al. .................... 438/123 |
| 2005/0023550 A1 | 2/2005 | Eliashevich et al. |
| 2005/0231953 A1 | 10/2005 | Reeh et al. |
| 2006/0131599 A1* | 6/2006 | Slater et al. .................... 257/98 |
| 2006/0154393 A1 | 7/2006 | Doan et al. |
| 2006/0261364 A1* | 11/2006 | Suehiro et al. ............... 257/100 |
| 2007/0164306 A1* | 7/2007 | Nakahata et al. ............ 257/103 |
| 2007/0189007 A1* | 8/2007 | Nishimoto et al. ........... 362/227 |
| 2008/0087900 A1* | 4/2008 | Yang ............................... 257/82 |

FOREIGN PATENT DOCUMENTS

| | | |
|---|---|---|
| EP | 1 667 228 | 6/2006 |
| JP | 2002-050822 | 2/2002 |
| JP | 2005-014141 | 1/2005 |
| JP | 2005-252222 | 9/2005 |
| KR | 10-2006-0061568 | 6/2006 |
| WO | WO 01/39282 | 5/2001 |
| WO | WO 2005/043631 | 5/2005 |
| WO | WO 2006/004337 | 1/2006 |

* cited by examiner

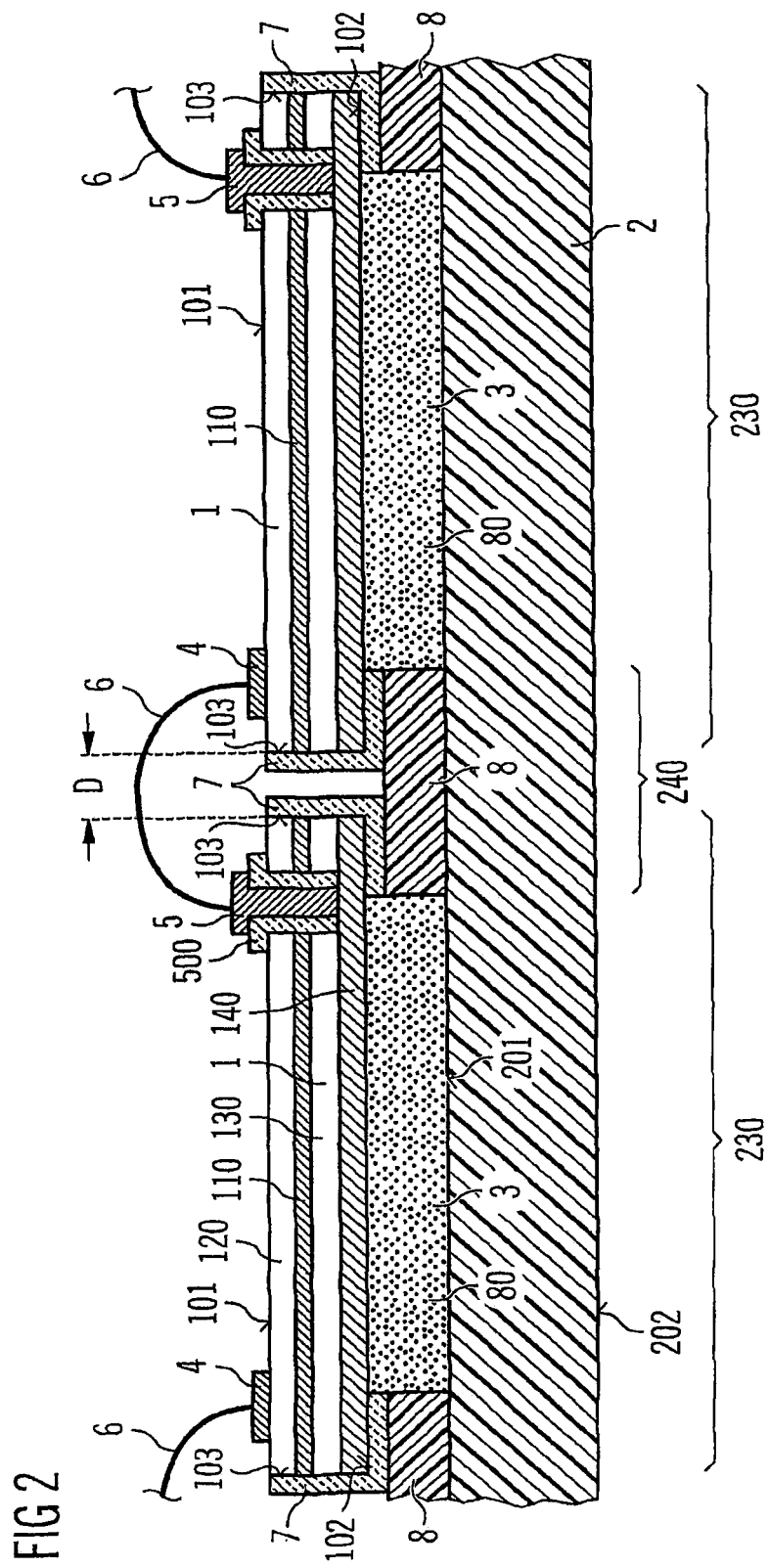

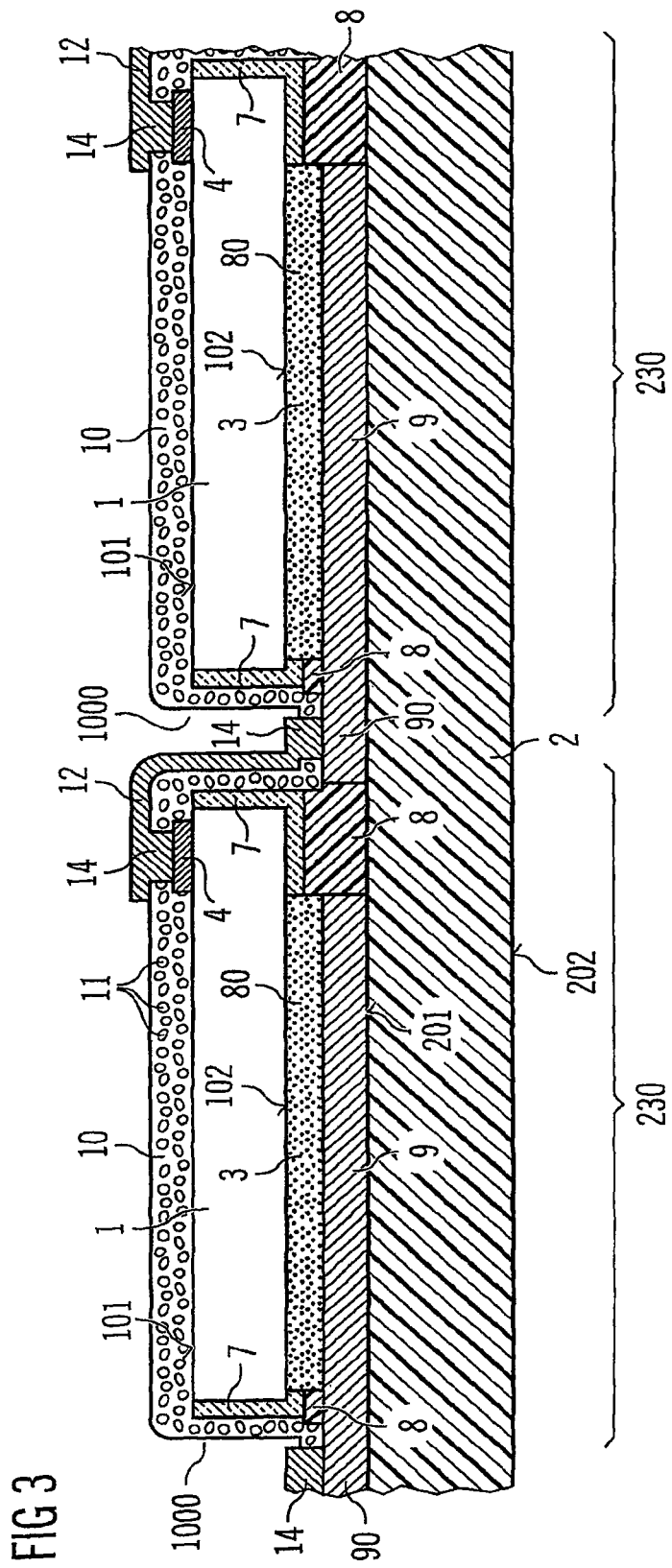

US 8,796,115 B2

LIGHT-EMITTING DIODE ARRANGEMENT AND METHOD FOR PRODUCING THE SAME

CROSS-REFERENCE TO RELATED APPLICATIONS

This patent application is a Continuation of U.S. patent application Ser. No. 12/442,411, filed on Mar. 23, 2009, which is a national stage of application No. PCT/DE2007/001733, filed on 25 Sep. 2007, which claims the priority of German patent applications 102006045691.2, filed on 27 Sep. 2006 and 102007021009.6, filed on 4 May 2007, the disclosure content of both of which are hereby incorporated by reference.

FIELD OF THE INVENTION

The invention relates to a light-emitting diode arrangement and to a method for producing the same.

BACKGROUND OF THE INVENTION

Light-emitting diode arrangements are known wherein a plurality of individually encapsulated LED components are arranged on a common carrier. Such light-emitting diode arrangements have an inadequate luminance and an insufficiently uniform luminance distribution for many applications.

In other known light-emitting diode arrangements, individual LED chips comprising an active semiconductor layer stack and a growth substrate and/or an auxiliary carrier are arranged on a common carrier. Gaps remain between the individual semiconductor layer stacks during the mounting of such LED chips. The gaps are caused for example by the mounting method, for instance owing to a limited placement accuracy and/or an adhesive rim sideways of the growth substrate and/or auxiliary carrier. Active semiconductor layer stacks arranged on an auxiliary carrier generally do not completely cover the latter, whereby the size of the gaps between the active semiconductor layer stacks is increased further. The gaps lead to regions of reduced luminance in the luminous area of the light-emitting diode arrangement and to nonuniformities in the luminance distribution.

SUMMARY OF THE INVENTION

Therefore, it is an object of the invention to specify a light-emitting diode arrangement which has a more homogeneous luminance.

A light-emitting diode arrangement according to an aspect of the invention comprises a plurality of semiconductor chips which are provided for emitting electromagnetic radiation from their front side and which are fixed by their rear side—opposite the front side—on a first main face of a common carrier body, wherein the semiconductor chips consist of a respective substrateless semiconductor layer stack and are fixed to the common carrier body without an auxiliary carrier.

The embodiments disclosed hereinafter in each case for one substrateless semiconductor layer stack relate preferably to a plurality, particularly preferably to all, of the semiconductor layer stacks of the light-emitting diode arrangement. Hereinafter, all explanations of the construction and the production of the light-emitting diode arrangement relate to the consideration thereof as seen in a plan view of the first main face of the carrier body and the front side of the semiconductor layer stack if nothing to the contrary is expressly specified or obvious.

The expression "substrateless semiconductor layer stack" in the present context denotes a stack of semiconductor layers that is grown epitaxially, in particular. However, the growth substrate necessary for the epitaxial growth is completely removed from the semiconductor layer stack or its thickness is at least greatly reduced, such that, in particular, only a thin residue of the growth substrate remains on the semiconductor layer stack. Moreover, the substrateless semiconductor layer stack preferably does not have an auxiliary carrier mechanically supporting it. The thickness of the substrateless semiconductor layer stack is expediently less than or equal to 20 µm, preferably less than or equal to 10 µm; by way of example, the thickness of the substrateless semiconductor layer stack is approximately 6 µm.

The substrateless semiconductor layer stack is suitable for emitting electromagnetic radiation from its front side when an electric current is impressed. For this purpose, the substrateless semiconductor layer stack preferably comprises a pn junction, a double heterostructure, a single quantum well or a multiple quantum well structure (MQW) for generating radiation. In this case, the designation "quantum well structure" does not exhibit any significance with regard to the dimensionality of the quantization. It thus encompasses, inter alia, quantum wells, quantum wires and quantum dots and any combination of these structures. Examples of MQW structures are described in the documents WO 01/39282, U.S. Pat. No. 5,831,277, U.S. Pat. No. 6,172,382 B1 and U.S. Pat. No. 5,684,309, the disclosure content of which in this respect is hereby incorporated by reference.

At its rear side facing toward the carrier body and opposite the front side, the semiconductor layer stack preferably comprises a reflective layer, for example a metallic layer, which reflects at least part of the electromagnetic radiation generated in the semiconductor layer stack back into the latter.

The semiconductor layer stack likewise preferably contains at least one semiconductor layer having at least one area which has an intermixing structure which ideally leads to an approximately ergodic distribution of the light in the semiconductor layer stack, that is to say that it has an as far as possible ergodically stochastic scattering behavior.

The substrateless semiconductor layer stack is to a good approximation a lambertian surface emitter and is therefore particularly well suited to the application in a headlight.

The substrateless semiconductor layer stacks are advantageously at a small distance from one another, such that a particularly homogeneous luminance distribution of the light-emitting diode arrangement is obtained. In particular, no growth substrate and/or auxiliary carrier projects laterally beyond the semiconductor layer stack.

By way of example, at least two semiconductor layer stacks, but preferably in each case two semiconductor layer stacks adjacent to one another, are at a distance of less than or equal to 100 µm. Particularly preferably, the distance is 50µ or less. In particular, therefore, the radiation-emitting regions of two adjacent semiconductor layer stacks are in each case 100 µm or less, preferably 50 µm or less, away from one another.

Advantageously, the light-emitting diode arrangement comprising substrateless semiconductor layer stacks additionally has a particularly small structural height. In one embodiment, the distance between the radiation-emitting front side of a semiconductor layer stack, in particular the largest distance between the front sides of the semiconductor layer stacks and the first main face of the carrier body, is less than or equal to 50 µm, preferably less than or equal to 20 µm, and particularly preferably less than or equal to 10 µm.

In one advantageous embodiment, the semiconductor layer stack is fixed to the carrier body by a fixing layer. The fixing layer is preferably applied to the carrier body only in a mounting region of the semiconductor layer stack. The mounting regions for different semiconductor layer stacks are disjoint, that is to say that they do not overlap. In other words, each fixing layer preferably covers only a partial region of the first main face of the carrier body and does not overlap a further fixing layer.

By way of example, the area contents of the main face—opposite the front side—of the semiconductor layer stack and of the fixing layer are substantially equal in magnitude. As an alternative, the semiconductor layer stack projects laterally beyond the fixing layer. To put it another way, the fixing layer, in a plan view of the rear side of the semiconductor layer stack, covers for example a central region of the rear side, while an edge region, in particular a circumferential edge region, of the rear side is free of the fixing layer.

The fixing layer contains for example a soldering metal such as AuSn or consists thereof.

In a further advantageous embodiment, at least one barrier frame is arranged on the first main face of the carrier body, said at least one barrier frame laterally delimiting a fixing layer at least in places. By way of example, a plurality of barrier frames are formed by means of webs on the carrier body. To put it another way, a structured barrier layer is arranged on the carrier body, said barrier layer having openings from the carrier body toward the semiconductor layer stack which are provided for receiving the fixing layers. As an alternative, a barrier frame can be formed by means of a depression in the barrier layer.

Preferably, the barrier frame completely encloses a fixing layer. Particularly preferably, each fixing layer is completely closed by a barrier frame.

Advantageously, the lateral extent of the fixing layer is delimited in this way. In the case of an electrically conductive fixing layer, for example, this significantly reduces the risk of an electrical short circuit between adjacent semiconductor layer stacks, which would otherwise be high in view of the small distance between the semiconductor stacks.

In a further advantageous embodiment, the semiconductor layer stack has an electrically insulating layer covering its rear side at least in places. By way of example, the electrically insulating layer, in a plan view of the rear side, covers an edge region, in particular a circumferential edge region, of the rear side and leaves a central region thereof free. In one embodiment, the electrically insulating layer is provided for laterally delimiting the fixing layer at least in places. Particularly preferably, the electrically insulating layer completely encloses the fixing layer. A lateral delimitation of the fixing layer is thus advantageously obtained at the same time. As an alternative or in addition, a further electrically insulating layer can be provided, which covers one or a plurality, in particular all, of the sidewalls of the semiconductor layer stack at least in places. By way of example, the electrically insulating layer, proceeding from the rear side of the semiconductor layer stack, is also drawn over the sidewalls thereof and represents the further electrically insulating layer there. The further electrically insulating layer advantageously reduces the risk of a short circuit of the pn junction, of the double heterostructure, of the single or multiple quantum well structure.

In one advantageous embodiment, the semiconductor layer stack has the shape of a rectangle or a square. In a further advantageous embodiment, the semiconductor layer stacks are arranged in a rectangular grid on the carrier body. A rectangular luminous area is advantageously obtained in this way. A particularly homogeneous luminance is obtained with rectangular or square semiconductor layer stacks arranged in a rectangular grid. By way of example, the regions of the carrier body that remain free, that is to say the regions that are not covered by semiconductor layer stacks but rather lie between the semiconductor layer stacks, are advantageously particularly small in this embodiment.

In a further embodiment, the rectangular grid has three rows and three columns. In this embodiment, the light-emitting diode arrangement therefore has nine semiconductor layer stacks arranged alongside one another in three rows and in three columns. However, the number of semiconductor layer stacks of the light-emitting diode arrangement is in no way restricted to this number. Rather, the light-emitting diode arrangement can advantageously comprise any desired number of semiconductor layer stacks without impairment of the homogeneity of the luminance and/or of the reliability occurring.

In a further advantageous embodiment, the semiconductor layer stack has two electrical contact regions suitable for electrical contact-making on its front side. To put it another way, the semiconductor layer stack is electrically connected by means of the electrical contact regions at its front side. In particular, each of the contact regions comprises an electrical contact area arranged on the front side of the semiconductor layer stack. Expediently, a first one of the two electrical contact regions is electrically conductively connected to the front side of the semiconductor layer stack and a second one of the two electrical contact regions is electrically conductively connected to the rear side of the semiconductor layer stack.

Advantageously, in the case of a semiconductor layer stack having two electrical contact areas on its front side, it is possible to dispense with an electrical connection region on the carrier body which is arranged alongside the semiconductor layer stack. Therefore, space for an electrical connection region does not have to remain between two semiconductor layer stacks. In this embodiment, therefore, the semiconductor layer stacks can advantageously be arranged particularly closely adjacent to one another. A particularly high luminance and a particularly homogeneous luminance distribution are thus advantageously obtained.

If a plurality of semiconductor layer stacks each have two electrical contact regions suitable for electrical contact-making on their front side, particularly reliable electrical contact-making of the semiconductor layer stacks is additionally obtained. It thus suffices for example to draw a bonding wire, by means of which the electrical contact-making is effected, from one semiconductor layer stack to an adjacent semiconductor layer stack. Long bonding wires drawn from one semiconductor layer stack across an adjacent semiconductor layer stack on to the carrier body are advantageously unnecessary. A simple and reliable interconnection of adjacent semiconductor layer stacks is obtained in this way, such that the light-emitting diode arrangement can be made flexible with regard to the arrangement and the number of the semiconductor layer stacks on the carrier body. In particular, light-emitting diode arrangements comprising a multiplicity of semiconductor layer stacks which have a particularly high luminance and a particularly homogeneous luminance distribution can be obtained. In this case, the semiconductor layer stacks are arranged alongside one another in rows and columns, in particular.

In another advantageous embodiment, the light-emitting diode arrangement has an electrical connection conductor for electrically connecting the semiconductor layer stacks, which comprises an electrically conductive layer arranged between a second main face—opposite the first main face—of the carrier body and the semiconductor layer stacks.

By way of example, the electrically conductive layer is situated on the first main face of the carrier body and covers said main face in places or completely. By way of example, at least one portion of the electrically conductive layer is arranged in the openings of the barrier frame. As an alternative or in addition, the barrier frame can be arranged on the electrically conductive layer at least in places.

In one development of this embodiment, the fixing layer is arranged on the electrically conductive layer. This is advantageous particularly when electrical contact is made with the semiconductor layer stack via its rear side by means of an electrically conductive fixing layer.

In a further advantageous embodiment, the carrier body has a multilayer structure. That is to say that the carrier body has a plurality of layers in the course from the first main face to the second main face. In one preferred embodiment, the electrically conductive layer of the electrical connection conductor is arranged between the first main face and the second main face of the carrier body. In other words, the electrically conductive layer runs in the interior of the carrier body. The electrical connection conductor expediently comprises at least one plated-through hole that produces an electrically conductive connection between the electrically conductive layer and the first main face.

Preferably, the electrical connection conductor also comprises a further electrically conductive layer, which is arranged on the first main face of the carrier body and which is electrically conductively connected to the plated-through hole or the plated-through holes. By way of example, the plated-through hole and/or at least one partial region of the further electrically conductive layer is arranged between the rear side of the semiconductor layer stack and the electrically conductive layer, such that these are in particular electrically conductively connected.

Preferably, the electrically conductive layer and/or the further electrically conductive layer is structured to form partial regions, which are in particular electrically insulated from one another. It preferably comprises individual conductor tracks.

Advantageously, a particularly flexible electrical interconnection of the individual semiconductor layer stacks is possible with an electrically conductive layer running in the interior of the carrier body. By way of example, when routing conductor tracks, there is no need to take account of the semiconductor layer stacks, such that a conductor track can be routed through below a semiconductor layer stack, for example. By way of example, particularly simple driving of light-emitting diode arrangements which comprise a multiplicity of semiconductor layer stacks is obtained in this way. In particular, the number of semiconductor layer stacks of the light-emitting diode arrangement is not limited by having to take account of interests of the electrical interconnection.

In a further advantageous embodiment, the semiconductor layer stack has a cutout. The cutout extends from the front side to the rear side over the entire thickness of the semiconductor layer stack. By way of example, the semiconductor layer stack, apart from the cutout, has the shape of a rectangle or square. To put it another way, a part of the rectangle or square is missing in the region of the cutout. The cutout is arranged for example at an edge or at a first corner of the rectangle or square. It has for example the shape of a circle segment, triangle, rectangle or square. In one advantageous embodiment, the semiconductor layer stack has, at a second corner of the rectangle or square, an electrical contact region suitable for electrical contact-making at the front side of the semiconductor layer stack. In one configuration, the first and second corners are adjacent to one another. In another embodiment, the second corner lies diagonally opposite the first corner.

In a further advantageous embodiment, the carrier body has an electrical connection region in the region of the cutout. By way of example, a partial region of the electrically conductive layer or area and/or of the further electrically conductive layer or area, in a plan view of the first main face of the carrier body, is arranged in the region of the cutout and represents the electrical connection region.

The electrical connection region is preferably electrically conductively connected to the rear side of the semiconductor layer stack or to the rear sides of a plurality of semiconductor layer stacks. If the light-emitting diode arrangement has an electrical connection conductor with an electrically conductive layer running between the first and the second main face of the carrier body, the electrical connection region, in one embodiment, as an alternative or in addition, is electrically conductively connected to the electrically conductive layer running between the first and the second main face of the carrier body.

In a further advantageous embodiment, the front side of the semiconductor layer stack and/or the first main face of the carrier body is covered by an electrically insulating cover layer at least in places.

In one expedient embodiment, the cover layer is at least partly, in particular practically completely, transmissive to the electromagnetic radiation emitted by the semiconductor layer stacks during operation of the light-emitting diode arrangement.

In another expedient embodiment, the cover layer contains a luminescence conversion material. The luminescence conversion material absorbs at least part of the electromagnetic radiation (primary radiation) emitted by the semiconductor layer stacks during operation and itself in turn emits electromagnetic radiation (secondary radiation), which generally has a different, in particular higher, wavelength than the primary radiation.

Preferably, the light-emitting diode arrangement emits mixed-colored light comprising unconverted electromagnetic radiation from the semiconductor layer stacks and converted electromagnetic radiation from the luminescence conversion material. As an alternative, it is also conceivable for the light-emitting diode arrangement not to emit mixed light, rather for the luminescence conversion material to shift the spectral distribution of the radiation. The luminescence conversion material contains for example an inorganic phosphor, for instance a garnet phosphor, which, in particular, is doped with one or a plurality of rare earths. Alkaline earth metal sulfides, thiogallates, aluminates and/or orthosilicates doped with rare earths are conceivable, in addition. In a further advantageous embodiment, the cover layer contains a colorant suitable for example for absorbing part of the light emitted by the semiconductor layer stack.

The light-emitting diode arrangement particularly preferably emits light that produces a white color impression. For this purpose, it preferably contains at least one semiconductor layer stack which emits electromagnetic radiation in the blue and/or ultraviolet spectral range and at least one luminescence conversion material which converts at least part of the blue and/or ultraviolet radiation of the semiconductor layer stack into electromagnetic radiation having a higher wavelength, for example in the yellow or orange spectral range. By way of example, if the semiconductor layer stack does not emit, or does not emit with sufficient intensity, in the blue spectral range but rather predominantly or exclusively in the ultraviolet spectral range, the cover layer preferably contains a further luminescence conversion material, suitable for converting ultraviolet radiation into blue light. As an alternative, however, single- or multicolored light-emitting diode arrangements which contain at least one semiconductor layer stack which emits red, green, yellow or blue light are also possible.

In one expedient embodiment, the cover layer at least partly leaves free electrical contact regions and/or electrical connection regions. In order to achieve this, the cover layer is removed from the electrical contact regions and/or electrical connection regions at least in places, which can be effected by means of laser ablation, for example. As an alternative, it can also be applied in structured fashion, for example through a mask which covers the electrical contact regions and/or electrical connection regions at least in places during the production of the cover layer.

In one particularly advantageous embodiment, an electrical contact-making layer is arranged on that side of the cover layer which is remote from the carrier body. The electrical contact-making layer preferably covers the electrical contact regions and/or electrical connection regions left free by the cover layer and is in particular electrically conductively connected to them. In one embodiment, the electrical contact-making layer is structured, for example to form partial regions such as conductor tracks, which are in particular electrically insulated from one another. By way of example, it electrically conductively connects two electrical contact regions, an electrical contact region and an electrical connection region and/or two electrical connection regions to one another. Preferably, the contact layer covers the semiconductor layers only in an edge region; by way of example, the contact layer covers only the first and/or the second electrical contact region.

Advantageously, particularly space-saving contact-making of the semiconductor layer stacks is obtained with the electrical contract-making layer, such that the light-emitting diode arrangement can advantageously have a particularly small structural height.

In another embodiment, the semiconductor layer stack has two contact regions suitable for electrical contact-making on its rear side facing the carrier body. In particular, each of the contact regions comprises an electrical contact area arranged on the rear side of the semiconductor layer stack. Analogously to an embodiment comprising two contact regions suitable for electrical contact-making on the front side, expediently a first one of the two electrical contact regions is electrically conductively connected to the front side of the semiconductor layer stack and a second one of the two electrical contact regions is electrically conductively connected to the rear side of the semiconductor layer stack.

Advantageously, in the case of a semiconductor layer stack having two electrical contact areas on its rear side, it is possible to dispense with bonding wires and electrical contact-making layers on the front side of the semiconductor body, which could for example reduce the luminance and/or impair the homogeneity thereof. Instead, electrical contact is made with the semiconductor body as early as during mounting on the carrier body.

If the connection to the carrier body is produced by means of fixing layers, expediently a separate fixing layer is assigned to each of the two contact areas arranged on the rear side of the semiconductor layer stack.

In a method for producing a light-emitting diode arrangement according to the invention, a carrier body comprising a plurality of mounting regions arranged alongside one another in a plan view of a first main face of the carrier body is provided and, at the same times or sequentially, in each mounting region, a fixing layer is formed on the first main face of the carrier body, a semiconductor chip provided for emitting electromagnetic radiation from its front side is positioned on the fixing layer in such a way that its front side is remote from the fixing layer, the semiconductor chip is aligned on the fixing layer, and a mechanically stable connection is produced between the semiconductor chip and the carrier body by means of the fixing layer, wherein the semiconductor chip consists of a substrateless semiconductor layer stack and no auxiliary carrier is arranged between the semiconductor layer stack and the carrier substrate.

By way of example, the fixing layer is applied to the carrier body in liquid form and/or melted or liquefied in some other way before or after the semiconductor layer stack is brought into contact with it.

The semiconductor layer stack is preferably aligned on the liquid fixing layer. In one advantageous embodiment, the semiconductor layer stack self-aligns on the fixing layer while the latter is present in liquid form. Preferably, the semiconductor layer stack aligns itself centrally on the liquid fixing layer. Without being tied to a specific explanation, it is assumed that this takes place on account of the surface tension of the liquid fixing layer and/or on account of adhesion forces. In the case of the central alignment, the projections of the centroids of the semiconductor layer stack and of the fixing layer, in a plan view of the first main face, after the alignment, are situated substantially at the same location.

A particularly good alignment of the semiconductor layer stack is advantageously achieved in an embodiment wherein the method comprises producing a barrier frame on the carrier body. The fixing layer is preferably produced in the opening of the barrier frame, such that the lateral extension of the fixing layer is delimited by the barrier frame at least in places. Preferably, the barrier frame completely encloses the fixing layer. In particular, it reduces the risk of the liquid fixing layer running out of the mounting region. The opening preferably has a circular, rectangular or square cross section. A good reproducibility of the position and the shape of the fixing layer in the mounting region is advantageously obtained in this way.

In a further advantageous embodiment of the method, a passivation layer is produced on an edge region of the rear side of the semiconductor layer stack before the latter is positioned on the fixing layer. By way of example, the surface properties of the semiconductor layer stack and of the passivation layer differ. In one embodiment, the fixing layer wets the rear side of the semiconductor layer stack, but not the passivation layer. The alignment of the semiconductor layer stack on the fixing layer is thus advantageously improved further.

The mechanically stable connection between the semiconductor layer stack and the carrier body is produced for example by solidification of the fixing layer, that is to say by the transition from the liquid to the solid state of aggregation, for example in the case of a fixing layer comprising a solder. As an alternative, it is produced by curing the fixing layer, for example if the latter comprises an adhesive.

In a further preferred embodiment of the method, a cutout is produced in the semiconductor body. This is done in particular before said semiconductor body is positioned on the fixing layer. The cutout can be produced for example by means of a sawing method (e.g. using a diamond saw blade) wherein part of the semiconductor body is sawn from the latter, or by means of an etching method (wet-chemical etching and/or dry etching). The cutout is preferably produced by means of laser separation (also called "laser dicing"), that is to say by separating off part of the semiconductor body by means of laser radiation. By way of example, a corner is removed from an originally rectangular or square semiconductor body.

In one advantageous embodiment of the method, provision is made of a carrier body having an electrical connection region which overlaps the cutout after the alignment of the semiconductor layer stack, such that after the alignment, the cutout is situated at least partly above the electrical connection region.

Further advantages and advantageous embodiments and developments of the invention will become apparent from the exemplary embodiments described below in conjunction with FIGS. 1A to 5.

BRIEF DESCRIPTION OF THE DRAWINGS

In the figures:

FIG. 2 shows a schematic sectional illustration of a detail from a light-emitting diode arrangement in accordance with a second exemplary embodiment;

FIG. 3 shows a schematic sectional illustration of a detail from a light-emitting diode arrangement in accordance with a third exemplary embodiment;

DETAILED DESCRIPTION OF THE PREFERRED EMBODIMENTS

In the figures, identical or identically acting constituent parts are in each case provided with the same reference symbols. The elements illustrated and their size relationships among one another should not be regarded as true to scale, in principle; rather, individual elements such as e.g. layers and/or distances may be illustrated with an exaggerated size and/or thickness for the sake of better representability and/or for the sake of a better understanding.

Figure 1A:
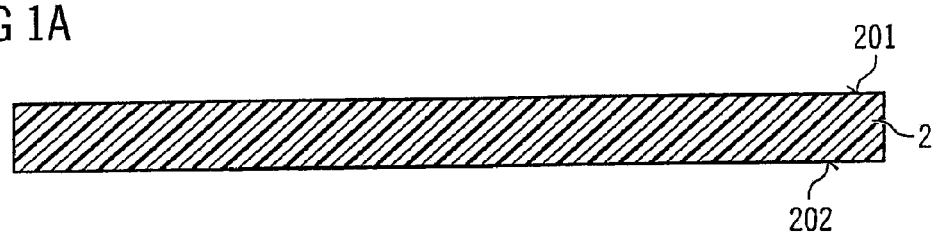
FIGS. 1A to 1C show schematic sectional illustrations of different stages of the method for producing a light-emitting diode arrangement in accordance with a first exemplary embodiment.
Figure 1B:
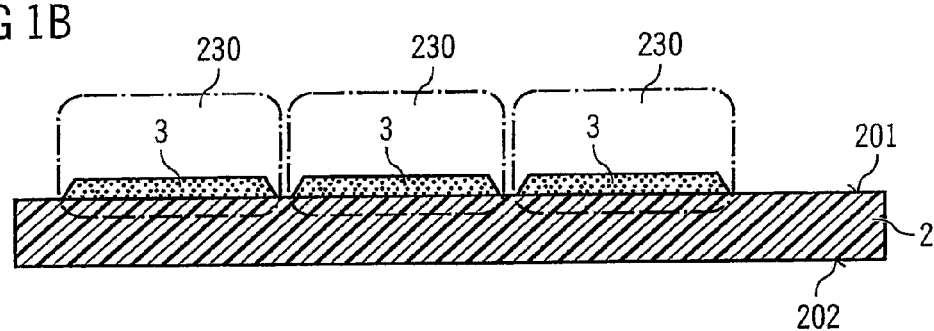

In the method for producing a light-emitting diode arrangement in accordance with the first exemplary embodiment, firstly a carrier body 2 is provided (see FIG. 1A). The carrier body in the present case is a printed circuit board (PCB). However, other carrier bodies are also conceivable. By way of example, as an alternative it is possible to use a plate as carrier body which comprises a plastic material, a glass, a ceramic material or a metal.

Subsequently, a plurality of fixing layers 3 is formed on a first main face 201 of the carrier body 2, that is to say on one of the areas of the carrier body 2 which are at least substantially parallel to the main extension plane of the carrier body 2. Each of the fixing layers 3 is arranged completely within a mounting region 230 of the carrier body 2. The mounting regions 230 are disjoint, that is to say that they do not overlap. The individual fixing layers 3 also do not mutually touch one another and they also do not overlap. By way of example, the fixing layers 3 contain a soldering metal, for example Sn, AgSn or AuSn, and are electrically conductively connected to a conductor track of an electrical connection conductor provided for making electrical contact with the semiconductor layer stacks (not shown). The conductor track is, in particular, a partial region of an electrically conductive layer 9 of the electrical connection conductor, said layer being formed on the first main face 201 of the carrier body 2. The layer thickness of the electrically conductive layer 9 is preferably less than or equal to 20 μm, particularly preferably less than or equal to 2 μm.

In a subsequent method step, a respective substrateless semiconductor layer stack 1 is arranged on each of the fixing layers 3. By way of example, a pick-and-place method is used for this purpose. For example, the semiconductor layer stacks 1 are provided on at least one intermediate carrier, for instance on a sapphire substrate or a film, are detached from the latter and—before or after detachment—are placed on the fixing layers 3. By way of example, a so-called UV release film or a so-called thermo-release film is suitable as the film. In the case of a UV release film or thermo-release film, in particular the detachment of the semiconductor layer stacks 1 from the UV release film is facilitated after irradiation thereof, with ultraviolet radiation or the detachment of said stacks from the thermo-release film is facilitated after the heating thereof. By way of example, the adhesion of the semiconductor layer stacks 1 to the film is reduced after the irradiation or heating. If a UV release film or thermo-release film is used as an intermediate carrier in the method, the method preferably comprises a method step wherein the UV release film or thermo-release film is irradiated with UV radiation or heated, respectively, before the detachment of the semiconductor layer stacks 1.

The substrateless semiconductor layer stacks 1 are provided for emitting electromagnetic radiation from their front side 101. For this purpose, they comprise an active layer 110, which has a quantum well structure in the present case. The semiconductor layer stacks 1 are based for example on a III/V compound semiconductor material, such as a nitride compound semiconductor material, or on a II-VI semiconductor material.

A III/V compound semiconductor material comprises at least one element from the third main group, such as Al, Ga, In, for example, and an element from the fifth main group, such as B, N, P, As, for example. In particular, the term "III/V compound semiconductor material" encompasses the group of binary, ternary or quaternary compounds which contain at least one element from the third main group and at least one element from the fifth main group, in particular nitride and phosphide compound semiconductors. Such a binary, ternary of quaternary compound can moreover comprise for example one or more dopants and additional constituents.

A II/VI compound semiconductor material correspondingly comprises at least one element from the second main group, such as Be, Mg, Ca, Sr, for example, and an element from the sixth main group, such as O, S, Se, for example. In particular, a II/VI compound semiconductor material comprises a binary, ternary or quaternary compound which comprises at least one element from the second main group and at least one element from the sixth main group. Such a binary, ternary or quaternary compound can moreover for example comprise one or more dopants and additional constituents. By way of example, the II/VI compound semiconductor materials include: ZnO, ZnMgO, CdS, ZnCdS, MgBeO.

In the present context, "based on nitride compound semiconductors" means that the semiconductor layer stack 1, or at least one layer thereof, comprises a nitride-III compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can comprise one or more dopants and additional constituents. For the sake of simplicity, however, the above formula only comprises the essential constituents of the crystal lattice (Al, Ga, In, N), even if these can be replaced in part by small quantities of further substances.

The semiconductor layer stack 1 comprises a metallic layer 150 for example at its rear side 102, that is to say at the area which runs substantially parallel to its main extension plane and which lies opposite the radiation-emitting front side 101. The metallic layer 150 contains a metal, for example Ag, or consists thereof. Preferably, the metallic layer 150 comprises a layer which is adjacent to the front side 101 and which consists of Ag, and a layer which is remote from the front side 101 and which represents a diffusion barrier for the soldering metal of the fixing layer 3 and which, in particular, contains TiWN and/or Ti/Pt or consists thereof. The layer thickness of the metallic layer 150 has for example a value of less than or equal to 5 μm, preferably of less than or equal to 2 μm; the metallic layer 150 preferably has a layer thickness of approximately 1 μm.

The metallic layer 150 imparts a particularly good adhesion between the semiconductor layer stack 1 and the fixing layer 3; by way of example, the metallic layer 150 or at least its area remote from the semiconductor layer stack 1 can be wetted particularly well by the soldering metal of the fixing layer 3. Moreover, the metallic layer 150, in particular the layer adjacent to the front side 101, preferably has good reflection properties. At least part of the radiation emitted by the active layer 110 during operation in the direction of the metallic layer 150 is reflected by the latter in the direction of the front side 101, such that the radiation emission from the front side 101 of the semiconductor layer stack 1 is advantageously increased in the case of a semiconductor layer stack 1 with metallic layer 150. The metallic layer 150 therefore represents in the present case a reflector layer, inter alia.

The semiconductor layer stacks 1 are produced on a growth substrate by means of an epitaxial growth method, the rear side 102 of the semiconductor layer stack 1 usually being remote from the growth substrate. However, the growth substrate is removed from the semiconductor layer stack, for example by a laser lift-off (LLO) method. As an alternative, the semiconductor layer stack 1 can also still have a, in particular thin, residue of the growth substrate. In contrast to conventional semiconductor bodies wherein the growth substrate is removed, no auxiliary carrier is arranged on the rear side 102 of the semiconductor layer stack.

The thickness of the semiconductor layer stack 1 as measured perpendicular to its main extension plane is for example less than or equal to 20 μm, in particular less than or equal to 10 μm; in the present case it is approximately 6 μm.

The distance H between the first main face 201 of the carrier body 2 and the front side 101 of the semiconductor layer stack 1 is therefore for example less than or equal to 25 μm, preferably less than or equal to 15 μm; in the present case it is approximately 10 μm.

In a plan view of the first main face 201 of the carrier body 2, adjacent semiconductor layer stacks 1 are at a distance D from one another of less than or equal to 100 μm. In the present exemplary embodiment, the distance D is approximately 50 μm.

For aligning the semiconductor layer stacks 1 on the carrier body 2, the fixing layers 3 in the present case are melted at the same times by application of heat.

In each mounting region 230, the semiconductor layer stack 1 aligns itself centrally on the respective melted fixing layer 3. Without being tied to a specific explanation, the alignment is imparted by the surface tension of the melted fixing layer 3 and by adhesion forces between the metallic layer 150 and the fixing layer 3. In particular, the small thickness and thus also the small weight of the semiconductor layer stack 1, which has no substrate or only a thinned substrate and which is not fixed on a separate auxiliary carrier, enables the self-alignment on the melted fixing layer 3.

The fixing layers 3 subsequently cool again. In the process, the fixing layer 3 solidifies in each mounting region 230 and thus produces an intimate connection between the metallic layer 150 of the semiconductor layer stack 1 and the carrier body 2. In the process, the substrateless semiconductor layer stacks 1 are mechanically stably, and in the present case also electrically conductively, connected to the carrier body 2.

As an alternative to a fixing layer comprising a soldering metal, the fixing layer 3 can for example also comprise an adhesive. The adhesive, in particular an adhesive based on epoxy resin, can be cured for example by irradiation with electromagnetic radiation, for example in the infrared and/or ultraviolet spectral range, and/or by heating.

Fixing layers 3 comprising an adhesive can be applied to the carrier body 2 for example in liquid form. After the positioning of the semiconductor layer stacks 1 and the central self-alignment thereof on the adhesive layers 3 in the mounting regions 230, analogously to the method steps described above, the adhesive is cured. This can be done for example by means of irradiation with electromagnetic radiation. Preferably, the carrier body 2 is at least partly transmissive to the electromagnetic radiation used for curing the adhesive. By way of example, a carrier body 2 which is a plastic or glass plate is used in this embodiment. Such an embodiment is expedient particularly when no electrical contact-making of the semiconductor bodies 1 by means of the carrier body 2 is intended.

In one configuration, the fixing layers 3 and the carrier body 2 are at least partly transmissive to radiation emitted by the semiconductor bodies 1 during operation. In this configuration, the light-emitting diode arrangement is preferably provided for emission through the carrier body 2.

In a further configuration, the adhesive is provided for electrical contact-making of the semiconductor bodies 1 with an electrical connection conductor of the carrier body 2. By way of example, an adhesive filled with electrically conductive particles, in particular epoxy resin adhesive, which can be activated in particular thermally and/or by means of ultraviolet radiation, is suitable for this. In particular, an adhesive filled with Ag particles is involved.

In one configuration, the particle size of the electrically conductive particles is less than or equal to 10 μm, preferably less than or equal to 5 μm, particularly preferably less than or equal to 2 μm. In this way, the risk of an electrical short circuit is advantageously low despite the small lateral distances between the semiconductor layer stacks 1. A high parallelism of the semiconductor layer stack 1 with respect to the carrier body 2 is advantageously obtained at the same time.

Figure 1C:
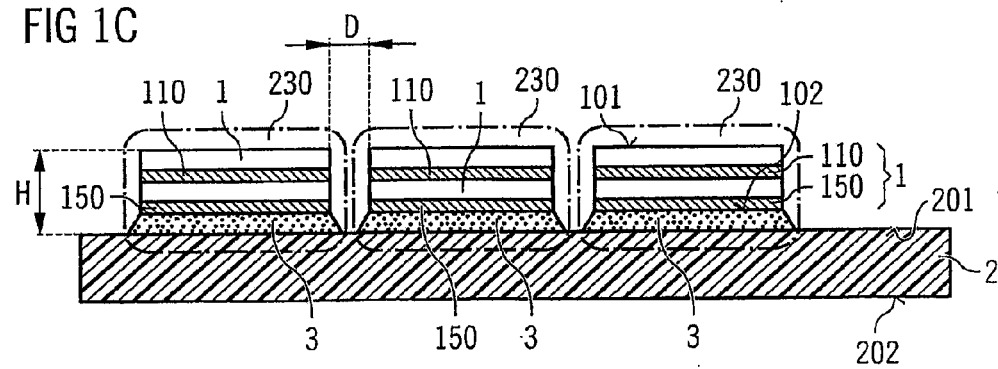

The light-emitting diode arrangement in accordance with the second exemplary embodiment, illustrated in FIG. 2, has, in contrast to the light-emitting diode arrangement in accordance with the first exemplary embodiment in FIG. 1C, a barrier layer 8 arranged on the first main face 201 of the carrier body 2.

The barrier layer 8 is structured, such that it represents a barrier frame having an opening 80 in each mounting region, the fixing layer 3 being arranged in said opening in a plan view of the first main face 201. In the direction from the carrier body 2 to the semiconductor layer stacks 1, the fixing layers 3 project beyond the barrier layer 8. The openings 80 advantageously delimit the extent of the fixing layers 3 in their main extension plane. Thus, the liquid, in particular melted, fixing layers 3 cannot flow out of the mounting region 230. Particularly in the case of electrically conductive fixing layers 3, the risk of adjacent fixing layers 3 possibly touching one another, and thus a short circuit between said fixing layers, which would otherwise be high owing to the small distance D between the semiconductor layer stacks 1, is reduced. The openings 80 of the barrier frames 8 advantageously define the positions of the fixing layers 3 in a plan view of the first main face 201 even if the fixing layers 3 are present in liquid form.

Moreover, what is achieved by means of the lateral delimiting of the fixing layer 3 by the barrier frames 8 is that the semiconductor layer stack 1, in a plan view of the first main face 201 of the semiconductor body 2, projects laterally beyond the fixing layer 3. Thus, despite a small distance D between adjacent semiconductor layer stacks 1, a larger distance between adjacent fixing layers 3 is obtained. A region 240 of the carrier body 2 remains between two fixing layers 3, in which the carrier body 2 is not covered by a fixing layer 3 in a plan view of its first main face 201. However, the region 240 is expediently covered by at least one semiconductor layer stack 1 at least in places.

Despite the small distance D between adjacent semiconductor layer stacks 1, the region 240 advantageously has parallel to the main extension plane of the carrier body 2 an extent that is large enough that a conductor track, for example, can be routed in this region 240. The conductor track is arranged for example between the barrier layer 8 and the carrier body 2. However, it is advantageously spaced apart from the fixing layers 3, such that no electrical short circuit arises.

In each semiconductor layer stack 1 in accordance with the second exemplary embodiment, moreover, a circumferential edge region of the rear side 102 of the semiconductor layer stack 1 is covered with an insulating layer 7, that is to say with a layer that provides electrical insulation. By way of example, the insulating layer 7 is a passivation layer. The insulating layer 7 preferably comprises a silicon oxide such as $SiO_2$, a silicon nitride such as $Si_3N_4$ and/or bis-benzocyclobutene (BCB), or consists of at least one of these materials. The insulating layer 7 can be amorphous or polycrystalline or have both amorphous and polycrystalline portions.

In the present exemplary embodiment, the insulating layer 7 also extends over the flanks 103 of the semiconductor layer stack 1. The insulating layer 7 thus reduces for example the risk of a short circuit, for example if two adjacent semiconductor layer stacks 1 touch one another.

In the second exemplary embodiment, electrical contact is made with the semiconductor layer stacks 1 from the front side 101 of the semiconductor layer stacks 1. For this purpose, in each semiconductor layer stack 1, a first electrical contact region 4, for instance a bonding pad, is arranged on an n-type contact layer 120 adjacent to the front side 101. A second contact region 5 runs from the front side 101 of the semiconductor layer stack 1 through the n-type contact layer 120, the active layer 110 and a p-side charge carrier confinement layer 130 and is electrically insulated from them by means of a passivation layer 500. It extends as far as a p-side current spreading layer 140 of the semiconductor layer stack 1, which is adjacent to the rear side 102 of said semiconductor layer stack. The first contact region 4 is therefore provided for the n-side electrical contact-making of the semiconductor layer stack 1 and the second contact region 5 is provided for the p-side electrical contact-making of the semiconductor layer stack 1.

A bonding wire 6 connects a contact area of the second contact region 5 that is arranged on the front side 101 of a first semiconductor layer stack 1 to the first contact region 4 of a second semiconductor layer stack 1 adjacent to the first stack. The semiconductor layer stacks 1 interconnected in this way are therefore connected in series.

In the case of at least one semiconductor layer stack 1, arranged at the edge of the light-emitting diode arrangement, the first contact region 4 is electrically conductively connected for example to an electrical connection location on the carrier body 2—for instance by means of a bonding wire 6. In the case of at least one further semiconductor layer stack 1, arranged at the edge of the light-emitting diode arrangement, the second contact region 5 is electrically conductively connected for example to a further electrical connection location on the carrier body 2, for example likewise by means of a bonding wire 6.

In the third exemplary embodiment in accordance with FIG. 3, the semiconductor layer stacks 1 likewise each have a first contact region 4 which, as described above, is arranged on the radiation-emitting front side 101 of the semiconductor layer stack 1.

In contrast to the exemplary embodiment in FIG. 2, however, in this exemplary embodiment an electrically conductive layer 9 of an electrical connection conductor is arranged between the first main face 201 of the carrier body 2 and the semiconductor layer stack 1, said electrically conductive layer being deposited on the carrier body 2, for example. The electrically conductive layer 9 comprises a metal, for example, and is structured to form partial regions electrically insulated from one another, such as conductor tracks, by means of which electrical contact is made with the semiconductor layer stacks at their rear side 102.

The electrically conductive layer 9 preferably comprises Au and/or Ag. The electrically conductive layer 9 particularly preferably has a multilayer structure. By way of example, it has a first layer, which is adjacent to the carrier body 2 and which comprises Cu or consists thereof, a second layer, which succeeds the first layer in the direction away from the carrier body 2 and preferably comprises Ni or consists thereof, and subsequently a third layer, which is remote from the carrier body 2 and which comprises Au and/or Ag or consists thereof. The first and/or the second layer can be replaced by a layer which comprises W or consists thereof. The first layer is galvanically reinforced in one development. The second layer represents a migration barrier, for example. The third layer serves for example as a protective and/or contact layer.

The barrier frame 8, in the present case in each mounting region 230, is applied in places on the electrically conductive layer 9 and arranged at other places on a region of the carrier body 2 which is left free by the electrically conductive layer 9.

As in the preceding exemplary embodiment, too, the fixing layers 3 are arranged in openings 80 of the barrier frames 8 in a plan view of the first main face 201. In this exemplary embodiment, too, each fixing layer 3 is therefore completely enclosed by a barrier frame 8 in a plan view of the first main face 201 of the carrier body 2. In contrast to the preceding exemplary embodiment, however, the fixing layer 3 is arranged on the electrically conductive layer 9 and produces an electrical contact between the latter and the semiconductor layer stack 1.

Moreover, for example a fixing layer 3 comprising a soldering metal wets the electrically conductive and in particular metallic layer 9 particularly well. This brings about improved adhesion between the fixing layer 3 and the carrier body 2, such that a particularly stable mechanical fixing of the semiconductor layer stack 1 with the carrier body 2 is obtained.

An electrically insulating cover layer 10 covers the front sides 101 of the semiconductor layer stacks 1 and in the present case is drawn over the flanks 103 thereof on to the electrically conductive layer 9 on to the barrier layer 8 and/or on to the first main face 201 of the carrier body 2.

The electrically insulating layer 10 is preferably practically completely transmissive to the electromagnetic radiation emitted by the semiconductor layer stacks 1 during operation. As an alternative, it can contain a luminescence conversion material 11, for example a cerium-doped yttrium aluminum garnet phosphor (YAG:Ce). This embodiment of the cover layer 10 is shown by way of example in the left-hand region of FIG. 3.

The luminescence conversion material absorbs at least part of the electromagnetic radiation emitted by the semiconductor layer stack 1 and, being excited by this absorption, itself emits fluorescence or phosphorescence radiation, preferably having a longer wavelength than the absorbed primary radiation.

The cover layer 10 has openings 14. In the region of the openings 14, the cover layer 10 does not cover the electrical contact regions 4 or the electrically conductive layer 9. By way of example, the cover layer 10 is applied to the semiconductor layer stacks 1 and the carrier body 2 as a closed area, to put it another way as a simply connected region, and is subsequently removed again in the region of the openings 14, for example by means of laser ablation.

Locations 90 of the electrically conductive layer 9 that are left free by the cover layer 10 represent electrical connection regions 90 provided for making electrical contact with the semiconductor layer stacks 1 from their rear side.

At least some of the electrical connection regions 90 are arranged in the region of cutouts 1000 of the semiconductor layer stacks 1. In the region of the cutouts 1000, the distance between two adjacent semiconductor layer stacks 1 is increased, such that a sufficient area for reliable electrical contact-making is advantageously available. In the region of the flanks 103 which is not affected by the cutout, however, the adjacent semiconductor layer stacks 1 are advantageously at the small distance D, which is approximately 50 µm, for example. The cutout 1000 therefore advantageously does not impair, or only slightly impairs, the homogeneity of the luminescence distribution of the light-emitting diode arrangement.

An electrical contact layer with a plurality of conductor tracks 12 electrically insulated from one another is arranged on the electrically insulating cover layer 10. In the exemplary embodiment in FIG. 3, a conductor track 12 extends from the first contact region 4 of the first semiconductor layer stack 1 to the electrical connection region 90 by means of which electrical contact is made with the adjacent, second semiconductor layer stack 1 at its rear side 102. A series connection of two adjacent semiconductor layer stacks 1 is thus realized.

The conductor tracks 12 are produced for example by means of a vaporization or sputtering process using an electrically conductive material containing in particular a metal or a transparent conducting oxide (TCO). The vaporization or sputtering is effected through a mask, for example. The mask can be a shadow mask or be produced by means of a photolithography step on the electrically insulating cover layer 10.

As an alternative, the conductor tracks 12 can also be produced by means of a printing method, for instance an inkjet, screen or pad printing method, by means of an electrically conductive paste or liquid. The electrically conductive paste or liquid contains, in particular, electrically conductive particles whose particle size is for example less than or equal to 10 µm, preferably less than or equal to 5 µm, particularly preferably less than or equal to 2 µm.

The conductor track 12 has a significantly smaller extent perpendicular to the first main face 201 of the carrier body 2 than the, in particular curved, bonding wire 6 in accordance with the exemplary embodiment of FIG. 2. The light-emitting diode arrangement in the present exemplary embodiment in accordance with FIG. 3 is therefore advantageously particularly flat, or, to put it another way, it has a particularly small structural height.

Figure 4A:
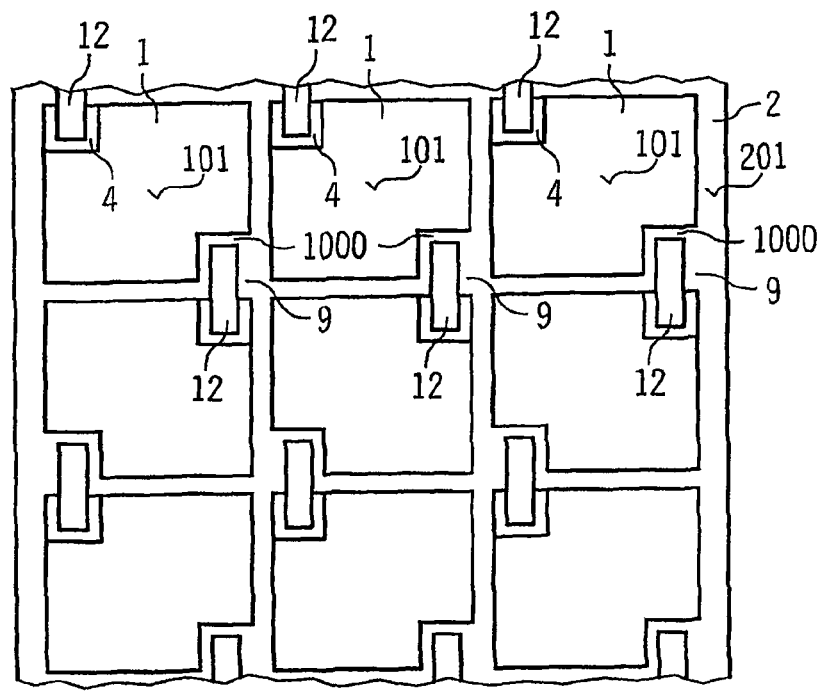
FIG. 4A shows a schematic plan view of the light-emitting diode arrangement in accordance with the third exemplary embodiment.

In this as well as in the previous exemplary embodiments, the semiconductor layer stacks 1 are arranged in a rectangular grid in a plan view of the first main face 201 of the carrier body 2. A detail from the light-emitting diode arrangement is illustrated in a schematic plan view of the first main face 201 of the carrier body 2 in FIG. 4A. The light-emitting diode arrangement in accordance with FIG. 4A comprises nine semiconductor layer stacks 1 arranged in three rows and three columns.

In a plan view of its front side 101, each of the semiconductor layer stacks 1 has essentially a rectangular, in the present case a square, shape and has a cutout 1000 arranged at a corner of the semiconductor layer stack 1. Furthermore, each semiconductor layer stack 1 has an electrical contact region 4 arranged at the corner which lies diagonally opposite the cutout 1000.

In this exemplary embodiment, the semiconductor layer stacks 1 arranged in rows are fixed in the same alignment alongside one another on the carrier body 2. Semiconductor layer stacks 1 which are adjacent to one another in the columns perpendicular to the rows are in each case rotated by 90 degrees relative to one another, such that the cutout 1000 of a semiconductor layer stack 1 is adjacent to the electrical contact region 4 of the semiconductor layer stack 1 that is adjacent in the same column. To put it another way, in the columns, the cutout 1000 of a semiconductor layer stack 1 and the contact region 4 of a semiconductor layer stack 1 that is adjacent in the column in each case face one another. The cutout 1000 is electrically conductively connected to the adjacent contact region 4 by one of the electrical conductor tracks 12, which run in the direction of the columns in the present case. The semiconductor layer stacks 1 arranged in columns are therefore connected in series.

The electrical contact regions 4 and the electrical connection regions 90 of the semiconductor layer stacks 1 which are arranged in the first and respectively in the last row are connected by means of conductor tracks 12 to a driver circuit (not shown), which in the present case is likewise arranged on the common carrier body 2 and is provided for driving the semiconductor layer stacks 1.

Figure 4B:
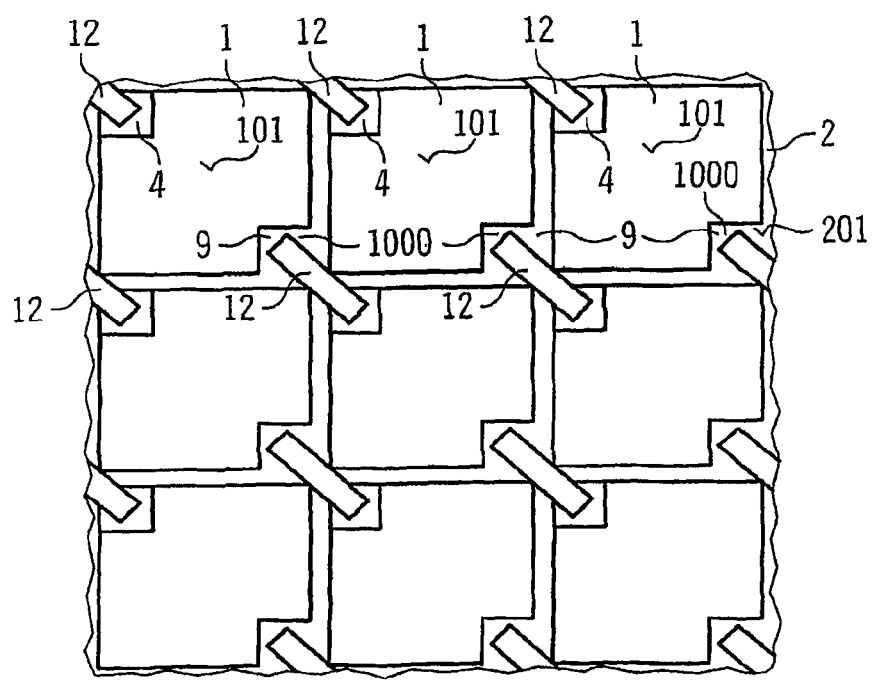
FIG. 4B shows a schematic plan view of a variant of the light-emitting diode arrangement in accordance with the exemplary embodiment of FIG. 4A.

In one variant of this embodiment, not only the semiconductor layer stacks 1 arranged in rows are fixed with the same alignment on the carrier body 2, but also the semiconductor layer stacks 1 adjacent in columns. This variant of the light-emitting diode arrangement is illustrated in FIG. 4B. In this exemplary embodiment, the light-emitting diode arrangement comprises for example semiconductor layer stacks in a rectangular grid having more than three rows and more than three columns.

In the variant in FIG. 4B, by way of example, two semiconductor layer stacks 1 are connected in series by a bonding wire 6 or an electrical conductor track 12 being drawn from the cutout 1000 of a first semiconductor layer stack 1 to the first contact region 4 of a semiconductor layer stack 1 that is adjacent in the direction of a diagonal of the rectangular grid. By way of example, the electrical conductor track 12 runs along said diagonal of the rectangular grid.

Figure 5:
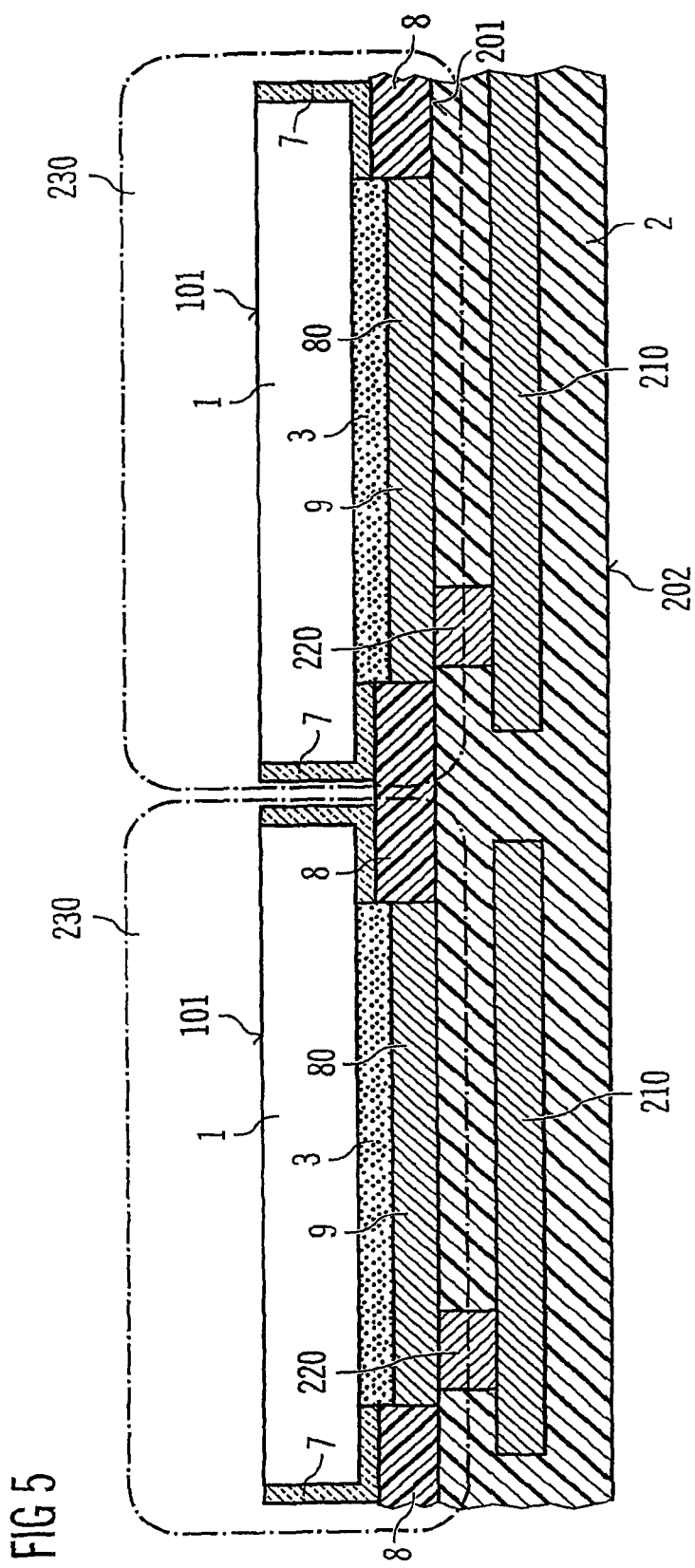
FIG. 5 shows a schematic sectional illustration of a detail from a light-emitting diode arrangement in accordance with a fourth exemplary embodiment.

If a carrier body 2 having a multilayer structure is used for the light-emitting diode arrangement, as in the fourth exemplary embodiment in accordance with FIG. 5, a particularly flexible interconnection of the individual semiconductor layer stacks 1 is possible.

The carrier body 2 in the exemplary embodiment in accordance with FIG. 5 has an electrical connection conductor for making electrical contact with the semiconductor layer stacks 1, which comprises a structured, electrically conductive layer 210 running between the first main face 201 and the second main face 202, that is to say in particular in the interior of the carrier body 2. The electrical connection conductor furthermore comprises plated-through holes 220 that run at some locations from the electrically conductive layer 210 to the first main face 201 of the carrier body 2. By way of example, at least one mounting region 230 of the carrier body 2 has such a plated-through hole 220. Preferably, a plurality of mounting regions 230, in particular each mounting region 230, have/has a respective plated-through hole 220.

A further electrically conductive layer 9 of the electrical connection conductor is arranged in openings 80 of the barrier frames 8. The partial regions of the further electrically conductive layer 9 which are arranged in the openings 80 are electrically insulated from one another by means of the barrier frames and are in each case electrically conductively connected to a plated-through hole 220. By way of example, the carrier body 2 is a multilayered ceramic carrier. The multilayered ceramic carrier is produced for example by joint sintering of a plurality of ceramic layers and at least the structured electrically conductive layer 210.

In this embodiment, for example each semiconductor layer stack 1 is driven individually. A particularly precise setting of the luminance is advantageously obtained in this way. By way of example, deviations in the brightness and/or the color impression of different semiconductor layer stacks 1 can be compensated for by means of a suitable electrical driving such as a pulsed power supply, which is known per se to the person skilled in the art and is therefore not explained in any greater detail at this juncture. The light-emitting diode arrangement in accordance with this exemplary embodiment therefore produces a particularly homogeneous color impression and has a particularly homogeneous luminance.

Figure 6:
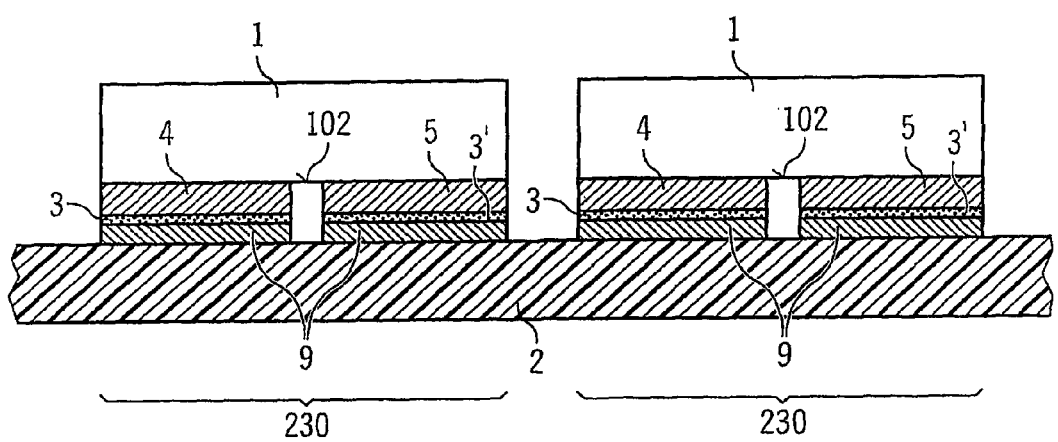
FIG. 6 shows a schematic sectional illustration of a detail from a light-emitting diode arrangement in accordance with a fifth exemplary embodiment.

FIG. 6 schematically illustrates a fifth exemplary embodiment of a light-emitting diode arrangement in cross section. In this exemplary embodiment, the first contact region 4 and the second contact region 5 are provided for contact-making from the rear side 102 of the semiconductor layer stack 1. For this purpose, the first and the second contact region 4, 5 have on the rear side 102 in each case a contact area that is electrically contact-connected and mechanically fixed to a respective conductor track 9 of the carrier body 2.

Analogously to the second contact region 5 of the second exemplary embodiment, for example the second contact region 5 is routed through the semiconductor layer stack 1, such that it makes contact with a contact layer adjacent to the front side 101 (not illustrated in FIG. 6). If, by way of example, the p-side of the semiconductor layer stack 1 faces the carrier body 2, then the first contact region 4 is provided for p-side contact-making and the second contact region is provided for n-side contact-making. As an alternative, the n-side of the semiconductor layer stack 1 can also face the carrier body 2.

The fixing of the semiconductor layer stack 1 is preferably effected by means of fixing layers 3 as in the previous exemplary embodiments. In this case, a fixing layer 3 is arranged between the contact area of the first contact region 4 and the assigned conductor track 9 and a further fixing layer 3' is arranged between the contact area of the second contact region 5 and the assigned conductor track 9. The fixing layer 3 and the further fixing layer 3' are disjoint, such that they do not electrically short-circuit the semiconductor layer stack 1, in particular.

In one preferred embodiment, a barrier frame 8 on the carrier body 2 and/or an electrically insulating layer 7 on the rear side 102 of the semiconductor body 1 delimits the fixing layer 3 and the further fixing layer 3' (not illustrated in FIG. 6). Particularly preferably, a partial region of the barrier frame 8 is arranged between the conductor tracks 9 which are assigned to the first and second contact regions 4, 5 of the semiconductor layer stack 1 and/or a partial region of the electrically insulating layer 7 is arranged between the first and the second contact region 4, 5. In particular, the electrically insulating layer 7 laterally encloses the contact areas of the first and second contact regions 4, 5.

The invention is not restricted to the exemplary embodiments by the description on the basis of said exemplary embodiments. Rather, the invention encompasses any new feature and also any combination of features, which in particular comprises any combination of features in the patent claims, even if this feature or this combination itself is not explicitly specified in the patent claims or exemplary embodiments.

What is claimed is:

1. A method for producing a light-emitting diode arrangement, comprising:
    providing a carrier body having a plurality of mounting regions arranged alongside one another in a plan view of a first main face of the carrier body and, at the same times or sequentially, in each mounting region;
    forming a fixing layer on the first main face of the carrier body;
    positioning a semiconductor chip provided for emitting electromagnetic radiation from its front side on the fixing layer in such a way that its front side is remote from the fixing layer;
    aligning the semiconductor chip on the fixing layer; and
    producing a mechanically stable connection between the semiconductor chip and the carrier body by means of the fixing layer,
    wherein the semiconductor chip comprises a substrateless semiconductor layer stack,
    wherein a barrier frame is applied to the carrier body in the mounting region, which laterally delimits the fixing layer, and
    wherein the barrier frame has an opening and the fixing layer is formed to fill the opening in a plan view of the first main face.

2. The method as claimed in claim 1, wherein the fixing layer is liquid during the alignment of the semiconductor chip.

3. The method as claimed in claim 2, wherein the fixing layer is melted before or after it is brought into contact with the semiconductor layer stack.

4. The method as claimed claim 2, wherein the semiconductor layer stack self-aligns on the fixing layer.

5. The method as claimed in claim 4, wherein the semiconductor layer stack aligns itself centrally on the fixing layer in a plan view of the first main face.

6. The method as claimed in claim 1, wherein an electrically insulating layer is applied to an edge region of a rear side—opposite the front side—of the semiconductor layer stack.

7. The method as claimed in claim 1, wherein
the carrier body has an electrical connection region;
a cutout is produced in the semiconductor layer stack; and
the semiconductor layer stack is aligned in such a way that the cutout is situated at least partly above the electrical connection region.

8. The method as claimed in claim 1, wherein the semiconductor chip lacks a growth substrate when it is positioned on the fixing layer.

9. The method as claimed in claim 1, wherein, in each mounting region, a barrier frame is formed on the first main face of the common carrier body,
the barrier frame laterally surrounds an opening, the fixing layer is formed in the opening such that it completely fills the opening in top view of the first main face and laterally adjoins the barrier frame.

10. A method for producing a light-emitting diode arrangement, comprising:
providing a plurality of substrateless semiconductor chips each of which is provided for emitting electromagnetic radiation from its front side;
providing a carrier body having a plurality of mounting regions arranged alongside one another in a plan view of a first main face of the carrier body and, at the same times or sequentially, in each mounting region;
forming a fixing layer on the first main face of the carrier body;
positioning one of the plurality of substrateless semiconductor chips on the fixing layer in such a way that its front side is remote from the fixing layer;
aligning the semiconductor chip on the fixing layer; and
producing a mechanically stable connection between the semiconductor chip and the carrier body by means of the fixing layer,
wherein
producing the plurality of susbtrateless semiconductor chips comprises growing a stack of semiconductor layers on a growth substrate and subsequently removing or thinning the growth substrate, and
the substrateless semiconductor chips are positioned on the respective fixing layers subsequent to removing or thinning the growth substrate.

11. The method as claimed in claim 10, wherein the substrateless semiconductor chips have a thickness of 20 μm or less when being positioned on the fixing layer.

12. The method as claimed in claim 10, wherein the fixing layer is liquid during the alignment of the semiconductor chip.

13. The method as claimed in claim 12, wherein the semiconductor layer stack self-aligns on the fixing layer.

14. The method as claimed in claim 10, wherein in each mounting region, a barrier frame is formed for laterally delimiting the fixing layer.

15. A method for producing a light-emitting diode arrangement, comprising:
providing a carrier body having a plurality of mounting regions arranged alongside one another in a plan view of a first main face of the carrier body and, at the same times or sequentially, in each mounting region;
forming a fixing layer on the first main face of the carrier body;
positioning a semiconductor chip provided for emitting electromagnetic radiation from its front side on the fixing layer in such a way that its front side is remote from the fixing layer;
aligning the semiconductor chip on the fixing layer; and
producing a mechanically stable connection between the semiconductor chip and the carrier body by means of the fixing layer,
wherein the semiconductor chip comprises a substrateless semiconductor layer stack,
wherein, in each mounting region, a barrier frame is formed on the first main face of the common carrier body, and
the barrier frame laterally surrounds an opening, the fixing layer is formed in the opening such that it completely fills the opening in top view of the first main face and laterally adjoins the barrier frame.

* * * * *